US007533011B2

(12) United States Patent
Armstead et al.

(10) Patent No.: US 7,533,011 B2
(45) Date of Patent: *May 12, 2009

(54) SIMULATING AND VERIFYING SIGNAL GLITCHING

(75) Inventors: Thomas Michael Armstead, Rochester, MN (US); Gregory Albert Dancker, Rochester, MN (US); Paul Emery Schardt, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/124,520

(22) Filed: May 21, 2008

(65) Prior Publication Data
US 2008/0221853 A1 Sep. 11, 2008

Related U.S. Application Data

(63) Continuation of application No. 11/154,905, filed on Jun. 16, 2005, now Pat. No. 7,428,483.

(51) Int. Cl.
*G06F 17/50* (2006.01)
*G06F 11/00* (2006.01)
(52) U.S. Cl. .......................................... 703/15; 714/41

(58) Field of Classification Search .................. 703/14, 703/15
See application file for complete search history.

(56) References Cited

U.S. PATENT DOCUMENTS

| 5,481,563 | A | 1/1996 | Hamre |
| 5,668,816 | A | 9/1997 | Douskey et al. |
| 6,771,728 | B1 | 8/2004 | Abernathy |
| 7,020,803 | B2 | 3/2006 | Wolin et al. |
| 7,251,573 | B2 | 7/2007 | Sanduleanu et al. |

*Primary Examiner*—Paul L Rodriguez
*Assistant Examiner*—Eunhee Kim
(74) *Attorney, Agent, or Firm*—Martin & Associates, LLC

(57) ABSTRACT

A simulation system includes glitch injection circuitry in one or more hardware design units to allow the injection of glitches or noise to evaluate the system's response to errors on signals between the hardware design units. The simulation system includes a stimulation module with a set of drivers to input simulation patterns into the design units. Some inputs to software models are driven by the outputs of software models of another design unit. The stimulation module can monitor these signals driven by the software model but it is difficult for the stimulation module to directly drive these signals. The added glitch circuitry allows injection of errors into the simulated hardware by the stimulation module on signals that are not directly driven by the stimulation module but are driven by the outputs of hardware design units.

10 Claims, 6 Drawing Sheets

SIMULATING AND VERIFYING SIGNAL GLITCHING

CROSS-REFERENCE TO PARENT APPLICATION

This patent application is a continuation of U.S. Ser. No. 11/154,905 filed on Jun. 16, 2005, which is incorporated herein by reference.

BACKGROUND OF THE INVENTION

1. Technical Field

This invention generally relates to electronic system simulation and development, and more specifically relates to verifying and testing signal glitching in a hardware simulation and testing environment.

2. Background Art

Today's integrated circuit (IC) systems are often a highly complex combination of hardware and software that must function within very specific constraints in order for the computer system to operate as designed. Computer aided design tools allow IC designers to model a new design and to model how the new design will interact with and respond to other systems or components prior to production. Modeling with computer aided design tools can significantly accelerate the design process and reduce the time to market for IC systems, which can be a competitive advantage. This modeling is typically accomplished by using simulation systems that model hardware function and performance in software.

Simulation has long been a preferred method for verification of logical correctness of complex electronic circuit designs. Simulation is broadly defined as the creation of a model which, if subjected to specific stimuli, responds in a similar way to the manufactured and tested hardware. More specifically, the term "simulation" is typically used when such a model is implemented as a computer program. In contrast, the term "emulation" is the creation of a model using programmable (also known as reconfigurable) logic or field-programmable gate array (FPGA) devices. Simulation/Emulation saves a significant amount of time and financial resources because it enables designers to detect design errors before the expensive manufacturing process is undertaken. Moreover, the design process itself can be viewed as a sequence of steps where the initial general concept of a new product is being turned into a detailed blueprint. Detecting errors at the early stages of this process also saves time and engineering resources.

The typical IC design process describes the IC logic in Very high speed IC Hardware Description Language (VHDL) or some other type of hardware description language, and then feeds the hardware description language into a simulation system. The designer then interacts with the simulation system to simulate and evaluate the operation of the proposed IC design by applying stimuli to the hardware design.

Referring now to FIG. 8, a prior art simulation system 800 for simulating a combination of design units 822, 824, 826 and 828. Design unit 1 (822) and design unit 4 (828) represent complex digital designs such as a micro-processor or graphics processor. Design unit 2 (824) and design unit 3 (826) represent physical link layers for design unit 1 and design unit 4 respectively. The physical link layer provides a high speed connection between two or more logic units. In the simulation system 800, there is typically a stimulation module 830 to communicate with the design units. The stimulation module 830 provides a means for injecting signals into the software model that includes a user interface 832 and a unit driver/checker 834. In some simulation systems the stimulation module may be called a simulation environment. In a preferred embodiment, the stimulation module is a simulation environment called Run Time eXecutable (RTX). The RTX is part of a simulation system developed by International Business Machines Corporation.

It is often difficult for the RTX to drive the signals between the physical link layers where the signals are driven by the software models of the hardware design units. In a simulation environment with multiple design units where the RTX can not readily drive the signals between the design units, there is a need for a way to inject noise or errors on these signals. Without a way to inject error signals into lines that are not readily controlled by the simulation system, the computer industry will continue to suffer with an inadequate simulation and testing environment.

DISCLOSURE OF INVENTION

According to the preferred embodiments, a simulation system includes glitch injection circuitry in one or more hardware design units to allow the injection of glitches or noise to evaluate the system's response to errors on signals between the hardware design units. The simulation system includes a stimulation module with a set of drivers to input simulation patterns into the design units. Some inputs to software models are driven by the outputs of software models of another design unit. The stimulation module can monitor these signals driven by the software model but it is difficult for the stimulation module to directly drive these signals. The added glitch circuitry allows injection of errors into the simulated hardware by the stimulation module on signals that are not directly driven by the stimulation module but are driven by the outputs of hardware design units.

Other embodiments are directed to adding the same glitch injection circuitry in the actual hardware. Adding the same glitch injection circuitry in the actual hardware will allow similar testing of signals between design units by injecting errors as done in the software model environment. Further, adding the same glitch injection circuitry in the actual hardware may allow testing of the hardware using the same set of inputs used by the stimulation module to drive the software model.

The foregoing and other features and advantages of the invention will be apparent from the following more particular description of preferred embodiments of the invention, as illustrated in the accompanying drawings.

BRIEF DESCRIPTION OF DRAWINGS

The preferred embodiments of the present invention will hereinafter be described in conjunction with the appended drawings, where like designations denote like elements, and.

BEST MODE FOR CARRYING OUT THE INVENTION

The present invention relates to a hardware simulation environment and hardware testing. In preferred embodiments, a simulation system includes glitch injection circuitry in one or more hardware design units to allow the injection of glitches or noise to evaluate the system's response to errors on signals between the hardware design units. The simulation system includes a stimulation module with a set of drivers to input simulation patterns into the design units. Some inputs to software models are driven by the outputs of software models of another design unit. The stimulation module can monitor these signals driven by the software model but it is difficult for the stimulation module to directly drive these signals. The added glitch circuitry allows injection of errors into the simulated hardware by the stimulation module on signals that are not directly driven by the stimulation module but are driven by the outputs of hardware design units.

Figure 1:
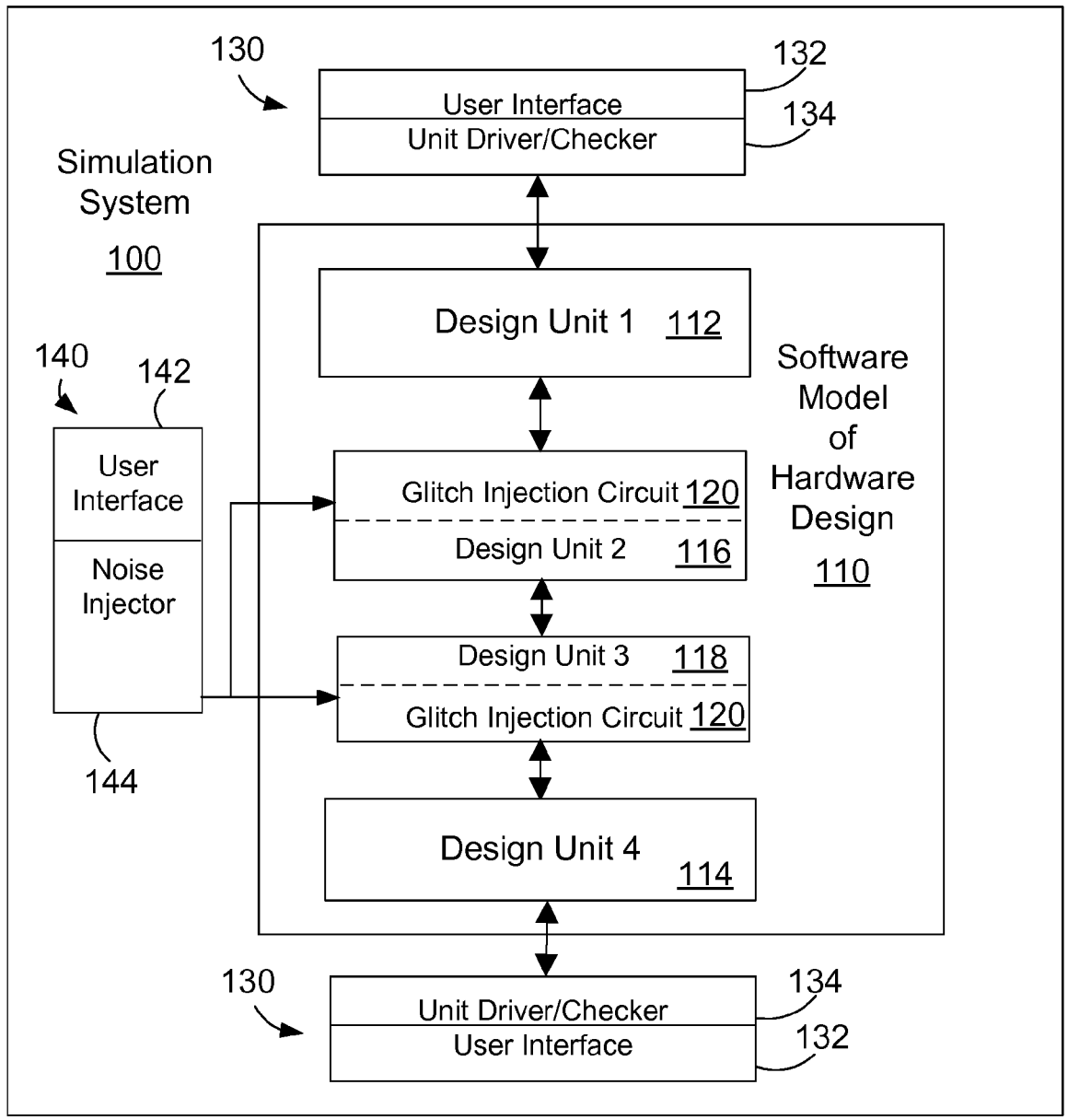
FIG. 1 is a block diagram of a simulation environment with a glitch injection circuit according to a preferred embodiment claimed herein.

FIG. 1 illustrates a hardware simulation system 100 in accordance with a preferred embodiment claimed herein. The simulation system 100 includes a software model 110 of a hardware design. The software model may be described by a hardware description language such as VHDL or Verilog. The software model 110 includes a combination of hardware design units 112, 114, 116 and 118. Design unit 1 (112) and design unit 4 (114) may comprise complex digital designs such as a micro-processor or graphics processor. Design unit 2 (116) and design unit 3 (118) represent physical link layers for design unit 1 and design unit 4 respectively.

Again referring to FIG. 1, the simulation system includes a stimulation module 130 for injecting test signals into the software model and checking the response of the software model to simulate the operation of the hardware design. Design units 1 and 4 are each shown to have a stimulation module 130. Those skilled in the art will appreciated that the stimulation modules shown may be implemented with a single stimulation module. The stimulation module 130 includes a user interface 132 and a unit driver/checker 134. In a preferred embodiment, the stimulation module 130 for injecting test signals and checking the response is a Run Time eXecution unit (RTX). As described above, the RTX may not readily be able to drive the signals between design unit 2 (116) and design unit 3 (118). In preferred embodiments, design unit 2 (116) and design unit 3 (118) include a glitch injection circuit 120. The glitch injection circuit is described further below. In a preferred embodiment, the glitch injection circuit is controlled by a stimulation module 140 in the simulation system 100. The stimulation module 140 may also be part of the same stimulation module 130 or RTX described above. Glitches or other errors can be injected into the simulation with the glitch injection circuit under control of the stimulation module 140 independent of the test stimuli for the design units as described further below. The simulation module 140 includes a user interface 142, and a noise injector 144.

Figure 2:
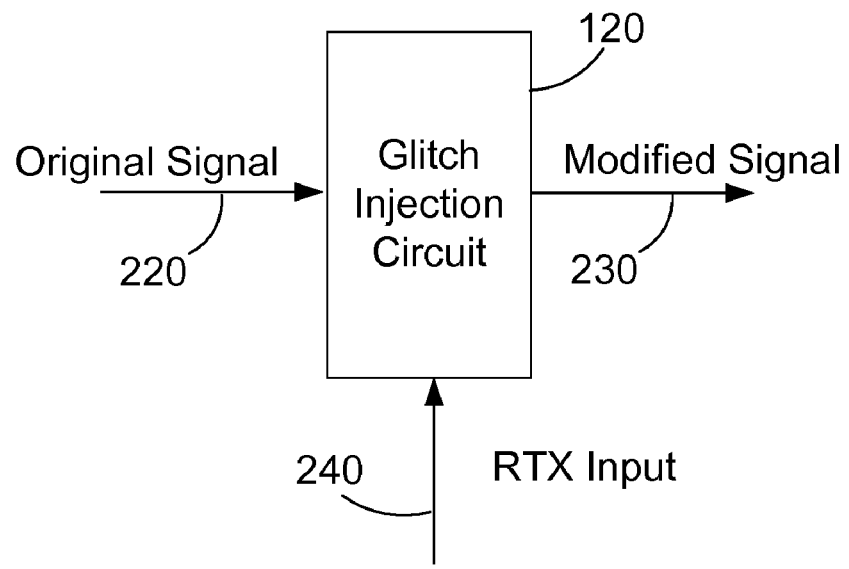
FIG. 2 represents a block diagram of the glitch injection circuit shown in FIG. 1.

FIG. 2 shows additional detail of the glitch injection circuit 120 described above in reference to FIG. 1. The glitch injection circuit 120 is used to modify signals that pass between the design units in the software model or in the hardware design as described further below. The glitch injection circuit 120 inputs an original signal 220 from one of the design units, and outputs a modified signal 230. The modified signal is similar to or follows the original signal input but includes an error or noise component as described further below. The glitch injection circuit is controlled inputs from the RTX 240.

Figure 3:
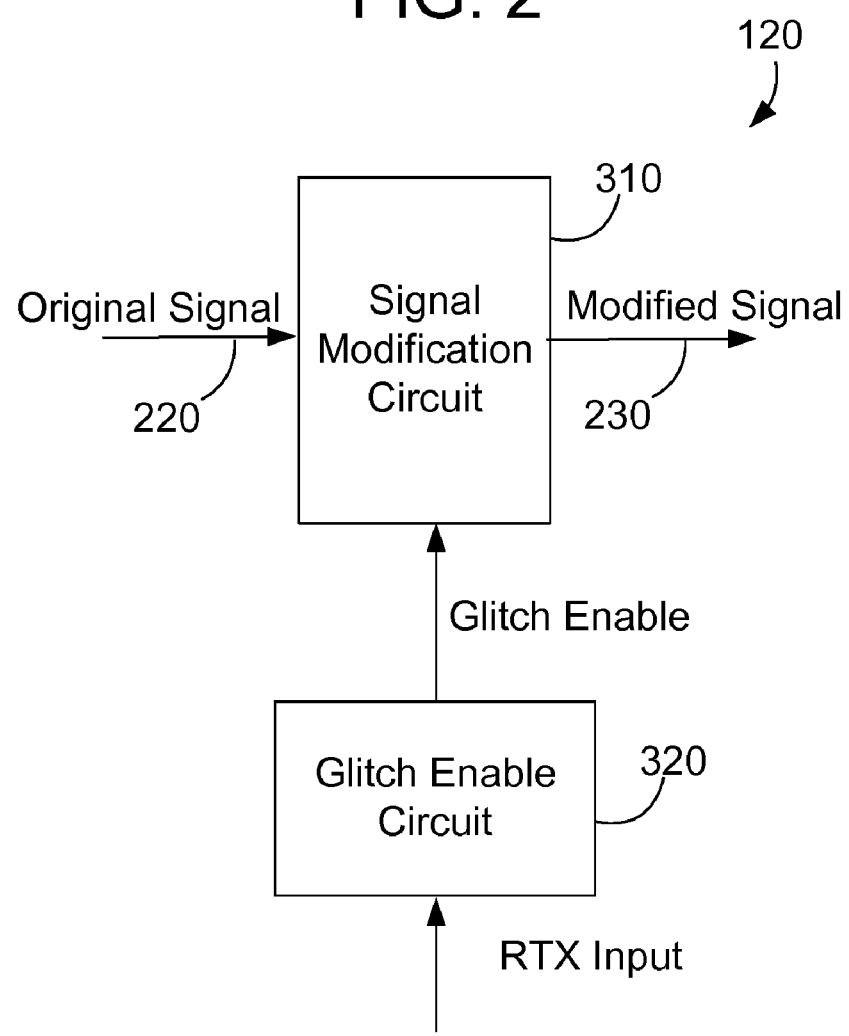
FIG. 3 is a more detailed block diagram of the glitch injection circuit shown in FIG. 2 according to preferred embodiments.

FIG. 3 shows more detail of the glitch injection circuit 120 according to preferred embodiments claimed herein. The glitch injection circuit 120 includes a signal modification circuit 310 that modifies the original signal 220 when directed by a glitch enable circuit 320. The signal modification circuit 310 and the glitch enable circuit 320 are described further below.

Figure 4:
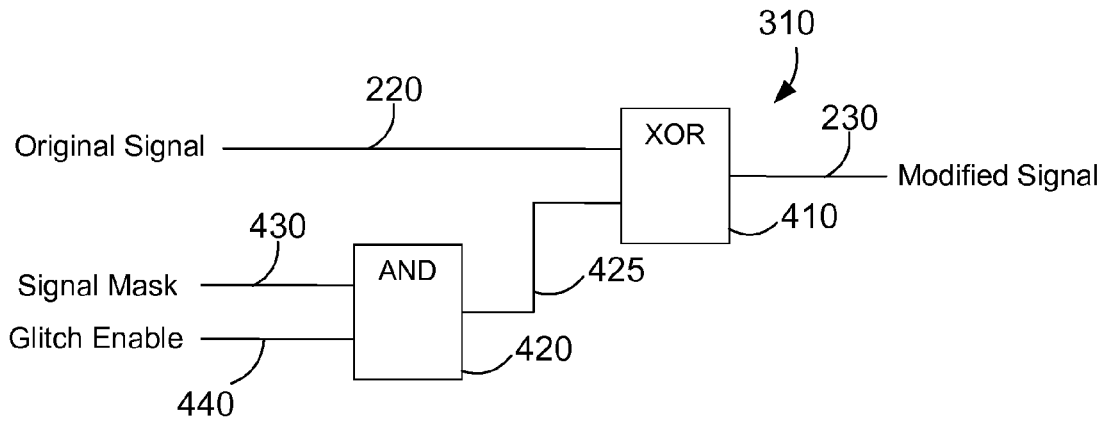
FIG. 4 is a more detailed circuit diagram of the signal modification circuit shown in FIG. 3 according to a preferred embodiment.

FIG. 4 illustrates a schematic diagram of the signal modification circuit 310 according to preferred embodiments claimed herein. The signal modification circuit 310 includes an Exclusive-OR gate 410 and an AND gate 420. The Exclusive-OR gate 410 operates on the original signal 220 and the output of the AND gate 420 to output the modified signal 230. The inputs to the AND gate 420 are signal mask 430 and glitch enable 440. For the normal mode of operation of the simulation, where there is no error injected into the signals, the glitch enable is a "0" to force the modified signal 230 to be the same value as the original signal 220. If glitch enable 440 is at a "1", the original signal 230 is modified according to the signal mask 430. If the signal mask is a "1", the modified signal 230 is the opposite value of the original signal 220. If the signal mask is a "0", the modified signal 230 is the same value as the original signal 220. During simulation, the signal mask 430 can be set by the stimulator module (RTX). In the hardware example below, the signal mask is generated by a register as described below.

Figure 5:
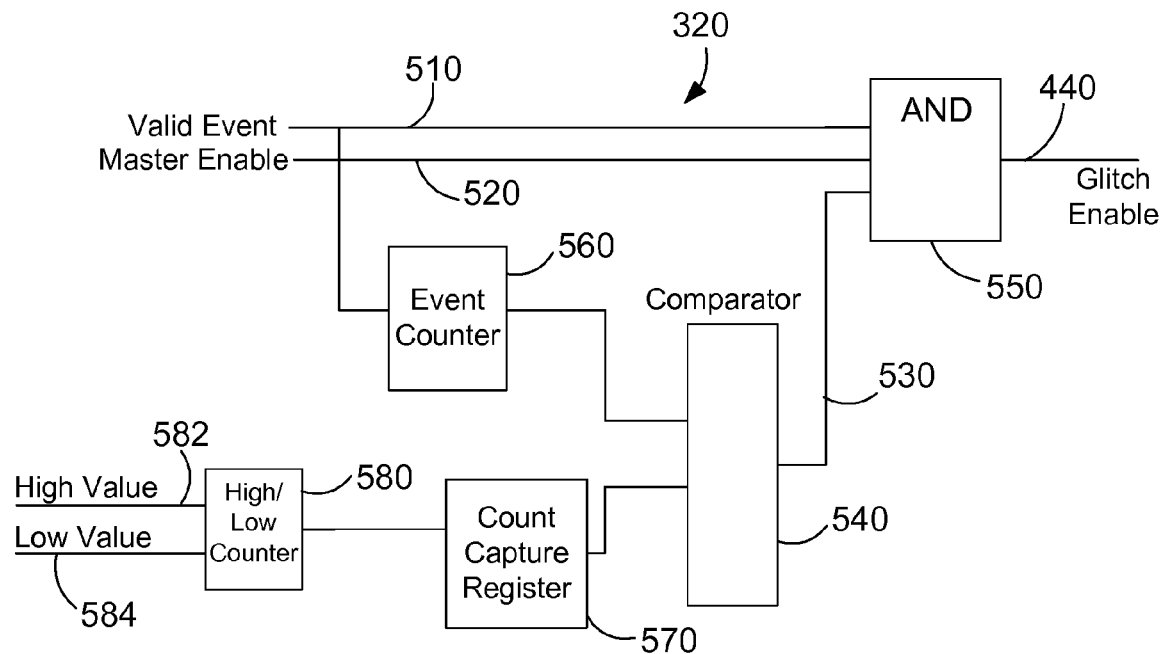
FIG. 5 is a more detailed circuit diagram of the glitch enable circuit shown in FIG. 3 according to a preferred embodiment.

FIG. 5 shows a schematic diagram of the glitch enable circuit 320 according to preferred embodiments claimed herein. The described embodiment is a simplified diagram where some control signals may not be shown, and for a specific type of signal (bus), there could be other control signals involved. The glitch enable circuit 320 has input signals valid event 510 and master enable 520. The valid event signal is driven by the software model and indicates a particular event that is being monitored for injection of an error. In the described embodiment, the valid event signal 510 indicates there is a valid packet on the bus. The master enable 520 is a signal driven by the RTX to enable a glitch injection. The valid event 510 and the master enable 520 along with a glitch event signal 530 from a comparator 540 are coupled to the inputs of AND gate 550. The output of AND gate 550 is the glitch enable signal 440 that is used in the signal modification circuit 310 described above. The valid event signal 510 is also connected to an event counter 560. The event counter 560 increments by one for each clock cycle that the valid event signal 510 is active. The event counter 560 resets to all zeroes at power up, and after a compare occurs. The output of the event counter 560 is connected to the comparator 540. The other input to the comparator 540 is the output of a count capture register 570. The count capture register 570 is used to capture a value from the Hi Lo Counter 580. The Hi Lo counter 580 has inputs high value 582 and low value 584 that are set by the stimulator (RTX).

Again referring to FIG. 5, the operation of the glitch enable circuit 320 will be described. The Hi Lo Counter 580 is a free running counter that increments by a clock signal (not shown) to provide a somewhat random signal for the glitch injection. The Hi Lo counter is initialized to the low value 584. When the Hi Lo counter reaches the high value 582, it is reset again to the Low Value. The High Value 582 and Low Value 584 are set by the stimulator (RTX). The Hi Lo counter is loaded into the count capture register 570 to use for the comparison. The count capture register 570 initializes to the Low Value 584. After a compare occurs, the current value in the Hi Lo Counter is loaded into this register for the next compare. The comparator 530 compares the value in the count capture register 570 with the value in the event counter 560. When the value of the event counter 560 is the same as the count capture register 570, the glitch event signal 530 is asserted to AND gate 550. The AND gate 550 will then assert the glitch enable 440 depending on the value of the valid event signal 510 and master enable signal 520. The valid event signal 510 is asserted when the signal to be glitched is valid. For example, if this circuit were to be used to glitch packet data, this would indicate that a valid packet was detected. The master enable signal is asserted by the simulator to enable or disable the glitch function. When both of these signals are asserted, the glitch event signal 530 is allowed to activate the glitch enable signal 440 through AND gate 550.

Figure 6:
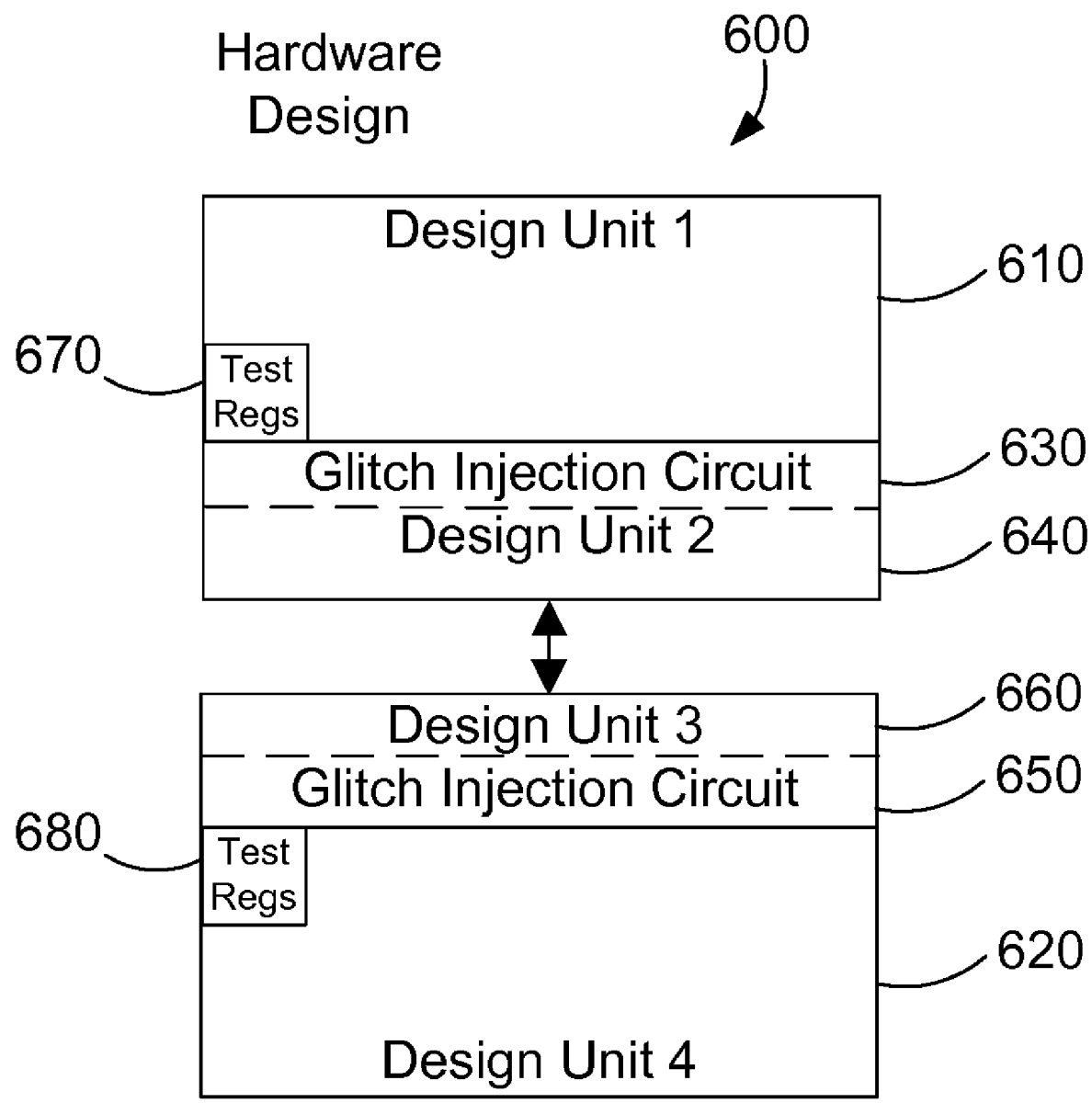
FIG. 6 is a block diagram of a hardware circuit with a glitch injection circuit according to another preferred embodiment.

FIG. 6 shows a hardware block diagram of an electronic system 600 according to another embodiment claimed herein. The electronic system 600 is a hardware embodiment of the simulation system described above. In the same manner that the glitch injection circuit described above with reference to FIG. 1 allowed the simulation of signal glitches, the electronic system 600 incorporates the same glitch injection circuit in the fabricated microcircuit to inject glitches into the hardware for testing purposes.

Again referring to FIG. 6, the electronic system 600 includes a first design unit 610 connected to a second design unit 620. Design unit 1 (610) and design unit 4 (620) represent complex digital designs such as a micro-processor or a graphics processor. Design unit 2 (640) and design unit 3 (660) represent physical link layers for design unit 1 and design unit 4 respectively. Glitch injection circuit 640 in design unit 2, and glitch injection circuit 650 in design unit 3 (660) represent the hardware equivalent of the glitch injection circuit 120 described above. The test registers 670 and 680 provide the same type of control to the Glitch Injection Circuit (630 and 650) as is provided by RTX (140, FIG. 1) for the glitch injection circuit 130 described above. For example, the control would include setting the High Value, Low Value, and Master Enable described with reference to FIGS. 4 and 5. Theses hardware registers would be updated by whatever means the hardware uses for updating other registers (e.g, memory mapped I/O).

Figure 7:
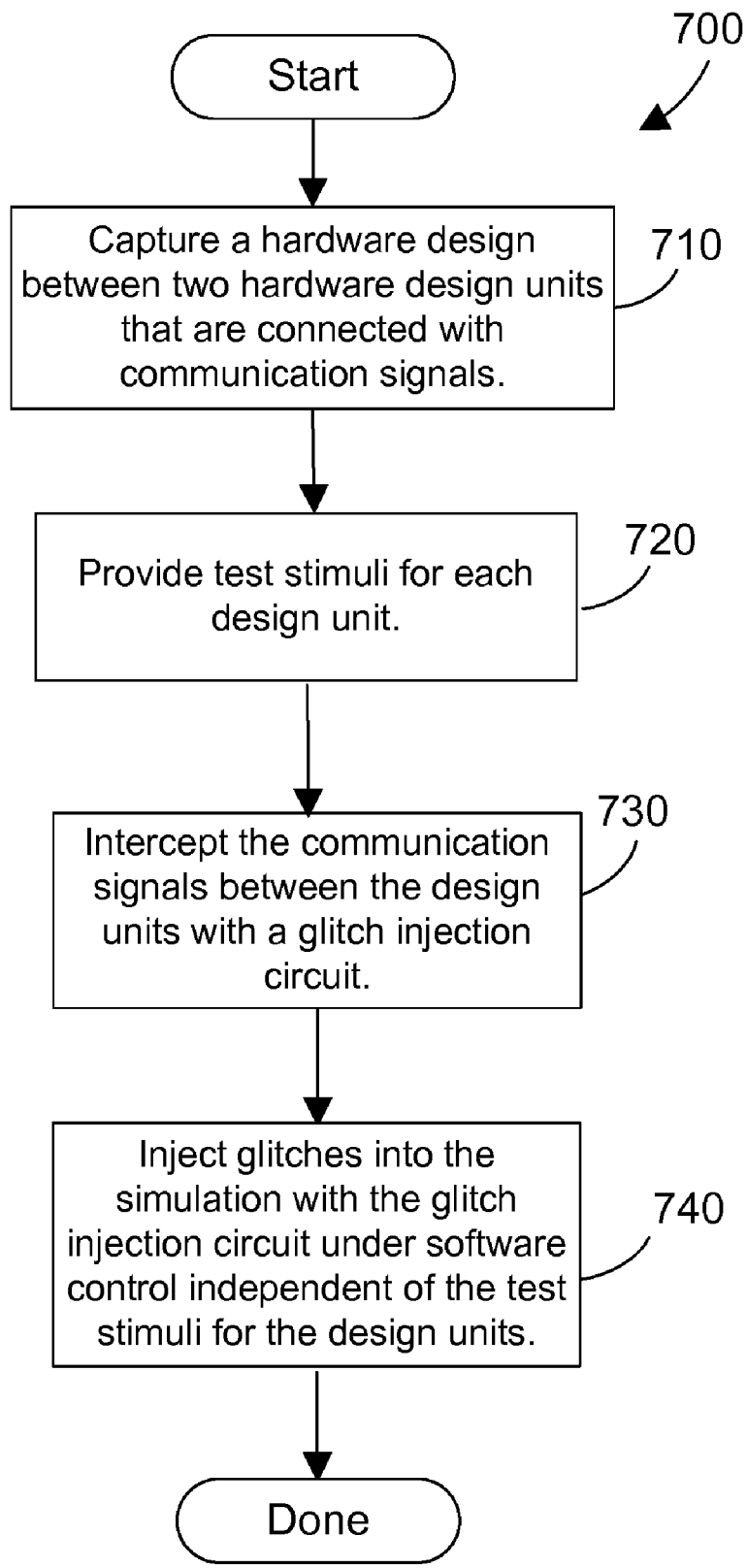
FIG. 7 is flow diagram for a method according to preferred embodiments.
Figure 8:
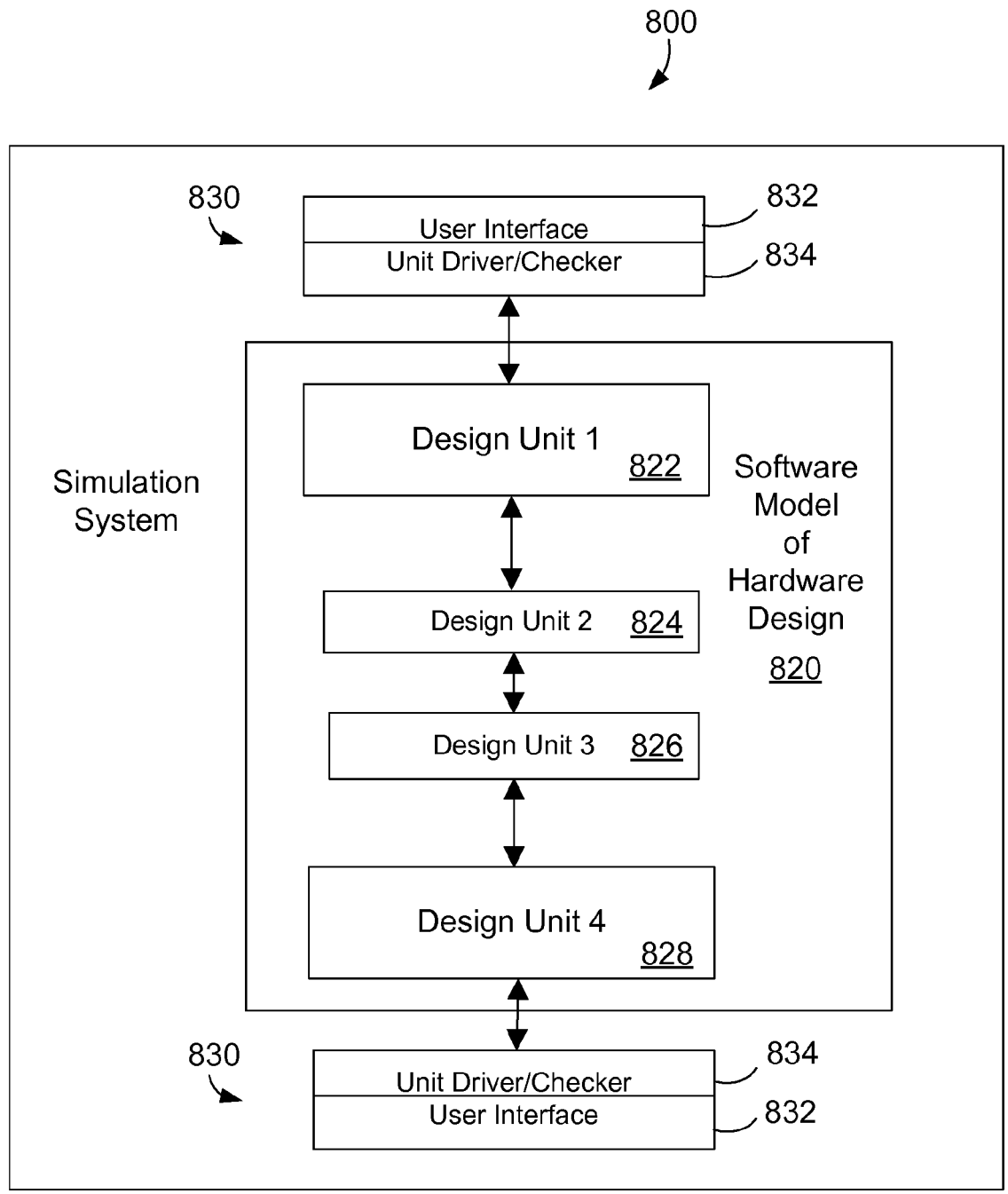
FIG. 8 is a block diagram of a simulator environment according to the prior art.

FIG. 7 illustrates a method 700 for injecting a glitch signal into a simulation system according to a preferred embodiment. Method 700 begins by capturing a hardware design between at least two hardware units that are connected with communication signals (step 710). Test stimuli for the hardware units is provided for each of the connected design units (step 720). The communication signals between the two design units are intercepted with a glitch injection circuit (step 730). The glitch injection circuit can be part of the hardware design units as modeled in the software model, or incorporated in actual hardware as described above. Glitches or other errors are then injected into the simulation or testing with the glitch injection circuit under software control independent of the test stimuli for the design units (step 740). It is important to note that while the present invention has been primarily described in the context of a simulation system, those skilled in the art will appreciate that embodiments of the present invention are capable of being distributed as a program product in a variety of forms, and that the present invention applies equally regardless of the particular type of computer-readable signal bearing media used to actually carry out the distribution. Examples of suitable computer-readable signal bearing media include: recordable type media such as floppy disks and CD RW, and transmission type media such as digital and analog communications links. Note that the preferred signal bearing media is tangible.

According to the preferred embodiments, a simulator system allows for simulation and emulation to take place at greater speeds and with increased flexibility than prior art systems. In a simulation system with multiple design units where there is no signal driver for the link between the design units, preferred embodiments provide a way to inject a noise or errors into signal lines on the link. The preferred embodiments allow the computer industry to improve the simulation and testing environment.

One skilled in the art will appreciate that many variations are possible within the scope of the present invention. Thus, while the invention has been particularly shown and described with reference to preferred embodiments thereof, it will be understood by those skilled in the art that these and other changes in form and details may be made therein without departing from the spirit and scope of the invention.

The invention claimed is:

1. A hardware simulation system comprising:
a processor;
a stimulation module executed by the processor for injecting test signals and
checking a response to simulate the operation of a hardware design;
a data storage coupled to the processor, said data storage including:
a software model of at least two hardware design units that comprise complex digital designs that communicate together in response to stimulus provided by the stimulation module in the simulation system; and
a glitch injection circuit in a link layer of at least one of the at least two hardware design units that intercepts communication signals between the hardware design units to inject errors in the communication signals under control of the stimulation module, wherein the communication signals between the hardware design units are not readily accessible to the stimulation module.

2. The hardware simulation system of claim 1 wherein the glitch injection circuit comprises a signal modification circuit and a glitch enable circuit.

3. The hardware simulation system of claim 2 wherein the signal modification circuit further comprises an Exclusive OR function between an original signal and a glitch signal.

4. The hardware simulation system of claim 3 wherein the glitch signal is produced by a logical AND of a signal mask signal and a glitch enable signal.

5. The hardware simulation system of claim 2 wherein the glitch enable circuit comprises a comparator that compares a value of an event counter and a count compare register to determine when to assert a glitch enable signal.

6. A hardware testing system comprising:
a processor;
a stimulation module executed by the processor for injecting test signals and
checking a response to simulate the operation of a hardware design;
a data storage coupled to the processor, said data storage including a hardware description language (HDL) simulation model of a design, said HDL simulation model including:
at least two hardware design units that comprise complex digital designs that communicate together in response to stimulus provided by the hardware testing system;
a glitch injection circuit comprising a signal modification circuit and a glitch enable circuit in a link layer of at least one of the at least two hardware design units that intercepts communication signals between the hardware design units to inject errors in the communication signals under control of glitch control software in the hardware testing system;

wherein the signal modification circuit comprises an Exclusive OR function between an original communication signal and a glitch signal, where the glitch signal is produced by a logical AND of a signal mask signal and a glitch enable signal;

wherein the glitch enable circuit comprises:

a comparator that compares a value of an event counter that indicates the occurrence of an event being monitored for injection of an error and a count capture register that captures a value of a Hi/Lo counter, where the Hi/Lo counter is a free running counter incremented by a clock signal to provide random glitch injection signal to the comparator; and an AND gate that ANDs the output of the comparator with a Valid Event signal and a Master Enable signal driven by the hardware testing system to produce the glitch enable signal.

7. A program product for use in a simulation system having a processor for executing a stimulator module; the program product comprising:

(A) a software model of at least two hardware design units that communicate together in response to stimulus provided by the simulation system, the software model further comprising a glitch injection circuit that intercepts communication signals between the hardware design units to inject errors in the communication signals under the control of the stimulator module in the simulation system, wherein the communication signals between the hardware design units are not readily accessible to the simulation system; and (B) tangible computer-recordable media bearing the software model for use by the simulation system and the stimulator module executing on the processor to simulate a hardware design.

8. The program product of claim 7 wherein the glitch injection circuit comprises a signal modification circuit and a glitch enable circuit.

9. The program product of claim 8 wherein the signal modification circuit comprises an Exclusive OR function between the original communication signal and a glitch signal.

10. The program product of claim 9 wherein the glitch signal is produced by a logical AND of a signal mask signal and a glitch enable signal.

* * * * *